United States Patent
McHerron et al.

(10) Patent No.: US 10,991,635 B2
(45) Date of Patent: Apr. 27, 2021

(54) MULTIPLE CHIP BRIDGE CONNECTOR

(71) Applicant: International Business Machines Corporation, Armonk, NY (US)

(72) Inventors: Dale Curtis McHerron, Staatsburg, NY (US); Kamal K. Sikka, Poughkeepsie, NY (US); Joshua M. Rubin, Albany, NY (US); Ravi K. Bonam, Albany, NY (US); Ramachandra Divakaruni, Ossining, NY (US); William J. Starke, Round Rock, TX (US); Maryse Cournoyer, Granby (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/517,568

(22) Filed: Jul. 20, 2019

(65) Prior Publication Data
US 2021/0020529 A1    Jan. 21, 2021

(51) Int. Cl.
*H01L 23/538* (2006.01)
*H01L 23/13* (2006.01)
(Continued)

(52) U.S. Cl.
CPC ............ *H01L 23/13* (2013.01); *H01L 23/538* (2013.01); *H01L 23/5381* (2013.01);
(Continued)

(58) Field of Classification Search
CPC .............. H01L 23/538; H01L 23/5385; H01L 23/5386; H01L 25/16; H01L 2224/16227;
(Continued)

(56) References Cited

U.S. PATENT DOCUMENTS 6,252,264 B1 *   6/2001   Bailey ................. H01L 25/0655
                                                                 257/203
7,671,449 B2    3/2010   Zingher et al.
(Continued)

FOREIGN PATENT DOCUMENTS

EP    3147943 A1    3/2017

OTHER PUBLICATIONS

Chip-to-chip interconnect integration technologies; Muneeb Zia, Chaoqi Zhang, Hyun Suk Yang, Li Zheng, and Muhannad Bakir; Georgia Institute of Technology, 345 Ferst Drive NW, Atlanta, GA 30318, USA; IEICE Electronics Express, vol. 13, No. 6, 1-16.

*Primary Examiner* — Steven T Sawyer
(74) *Attorney, Agent, or Firm* — Daniel P. Morris; Lou Perello, Attorney, PLLC

(57) ABSTRACT

The present invention includes a bridge connector with one or more semiconductor layers in a bridge connector shape. The shape has one or more edges, one or more bridge connector contacts on a surface of the shape, and one or more bridge connectors. The bridge connectors run through one or more of the semiconductor layers and connect two or more of the bridge connector contacts. The bridge connector contacts are with a tolerance distance from one of the edges. In some embodiments the bridge connector is a central bridge connector that connects two or more chips disposed on the substrate of a multi-chip module (MCM). The chips have chip contacts that are on an interior corner of the chip. The interior corners face one another. The central bridge connector overlaps the interior corners so that each of one or more of the bridge contacts is in electrical contact with each of one or more of the chip contacts. In some embodiments, overlap is minimized to permit more access to the surface of the chips. Arrays of MCMs and methods of making bridge connects are disclosed. Bridge connector shapes include:

(Continued)

rectangular, window pane, plus-shaped, circular shaped, and polygonal-shaped.

20 Claims, 11 Drawing Sheets

(51) Int. Cl.
 *H01L 27/24* (2006.01)
 *H01L 23/532* (2006.01)
(52) U.S. Cl.
 CPC .... *H01L 23/5385* (2013.01); *H01L 23/53295* (2013.01); *H01L 27/2481* (2013.01)
(58) Field of Classification Search
 CPC ....... H01L 2924/15311; H01L 23/5381; H01L 23/4821; H01L 23/13; H01L 23/53295; H01L 27/2481; H01G 4/30; H01G 4/232; H01G 4/2325; H01G 4/0085; H01G 4/228; H01G 4/1218; H05K 1/181; H05K 2201/10522; H05K 2201/10378; H05K 2201/10734; H05K 2201/10515; H05K 2201/10015
 USPC ..................... 257/E23.169, E23.17; 710/312
 See application file for complete search history.

(56) References Cited

U.S. PATENT DOCUMENTS

| | | | |
|---|---|---|---|
| 8,008,764 B2 | 8/2011 | Joseph et al. | |
| 8,227,904 B2 | 7/2012 | Braunisch et al. | |
| 9,431,371 B2 | 8/2016 | Karikalan et al. | |
| 9,711,428 B2 | 7/2017 | Braunisch et al. | |
| 10,163,833 B2 | 12/2018 | Wang et al. | |
| 2006/0095639 A1* | 5/2006 | Guenin | H01L 25/0655 710/310 |
| 2007/0216036 A1* | 9/2007 | Krishnamoorthy | H01L 25/50 257/782 |
| 2009/0089466 A1* | 4/2009 | Cunningham | H01L 24/73 710/100 |
| 2012/0261838 A1 | 10/2012 | Braunisch et al. | |
| 2014/0131854 A1* | 5/2014 | Hawk | H01L 24/06 257/737 |
| 2014/0177626 A1* | 6/2014 | Thottethodi | H01L 23/49838 370/351 |
| 2018/0315735 A1 | 11/2018 | Delacruz et al. | |
| 2019/0206798 A1* | 7/2019 | Collins | H01L 23/5385 |
| 2020/0098692 A1* | 3/2020 | Liff | H01L 25/0655 |

* cited by examiner

MULTIPLE CHIP BRIDGE CONNECTOR

BACKGROUND

The present invention relates to interconnection of devices including connections for power, control, and/or communication between those devices. More specifically, the invention relates to interconnections between multiple integrated circuit devices, e.g. semiconductor chips (chips).

With circuitry scaling to smaller and smaller dimensions, interconnections between and among chip circuitry is becoming more and more limiting on system manufacturing and performance.

Examples of current technologies interconnecting semiconductor chips (chips) include connections through a mother board (e.g. flex electrical connectors, optical interconnects, etc. on a motherboard); interposer layers (including silicon-based interposers, optical interposers, organic based interposer layers, etc.); silicon-bridged multi-interposer systems; etc.

While mother board connections have been used a long time, these connections face limitations as pitch between chip connections decreases and the density (number of interconnects between chips) increases. Also, bandwidth limitations can make these interconnections unsuitable for high data rate transmissions between chips.

Optical connections can handle high bandwidths but reduce efficiency due to the conversions between electrical and optical signals. Optical components also add complexity to the manufacturing of devices requiring communication between multiple chips.

Interposers can enable high densities of connections and accommodate higher bandwidth requirements for short connections, but these advantages diminish as the number of connections within the interposer increase.

Silicon-bridge technology, enabled by 2.5D and 3D integration on a substrate/wafer, can enable high-bandwidth communication between chips via a bridge. However, this technology introduces package complexity and substrate processing.

As there are increases in the number of chip contacts and contact pitch, chips on a module, and interconnections among those chips, particularly for smaller chip sizes with high bandwidth requirements, there is a need for interconnection designs that maximize the number of connections per surface area and minimize the distance between inter-chip connections and the overlap area of the connector over the chip surface.

SUMMARY

Embodiments of the present invention include a bridge connector with one or more semiconductor layers in a bridge connector shape. The shape has one or more edges, one or more bridge connector contacts on a surface of the shape, and one or more bridge connectors within the semiconductor layers. The bridge connectors run through one or more of the semiconductor layers and connect two or more of the bridge connector contacts. The bridge connector contacts are with a tolerance distance from one of the edges.

In alternate embodiments the bridge connector is a central bridge connector that connects two or more chips disposed on the substrate of a multi-chip module (MCM). The chips have chip contacts that are on an interior corner of the chip. The interior corners face one another. The central bridge connector overlaps the interior corners so that each of one or more of the bridge contacts is in electrical contact with each of one or more of the chip contacts. In some embodiments, overlap is minimized to permit more access to the surface of the chips.

Arrays of MCMs and methods of making bridge connects are disclosed.

BRIEF DESCRIPTION OF THE DRAWINGS

Various embodiments of the present invention will be described below in more detail, with reference to the accompanying drawings, briefly described below. The Figures show various structures and related method steps.

DETAILED DESCRIPTION

Figure 1:
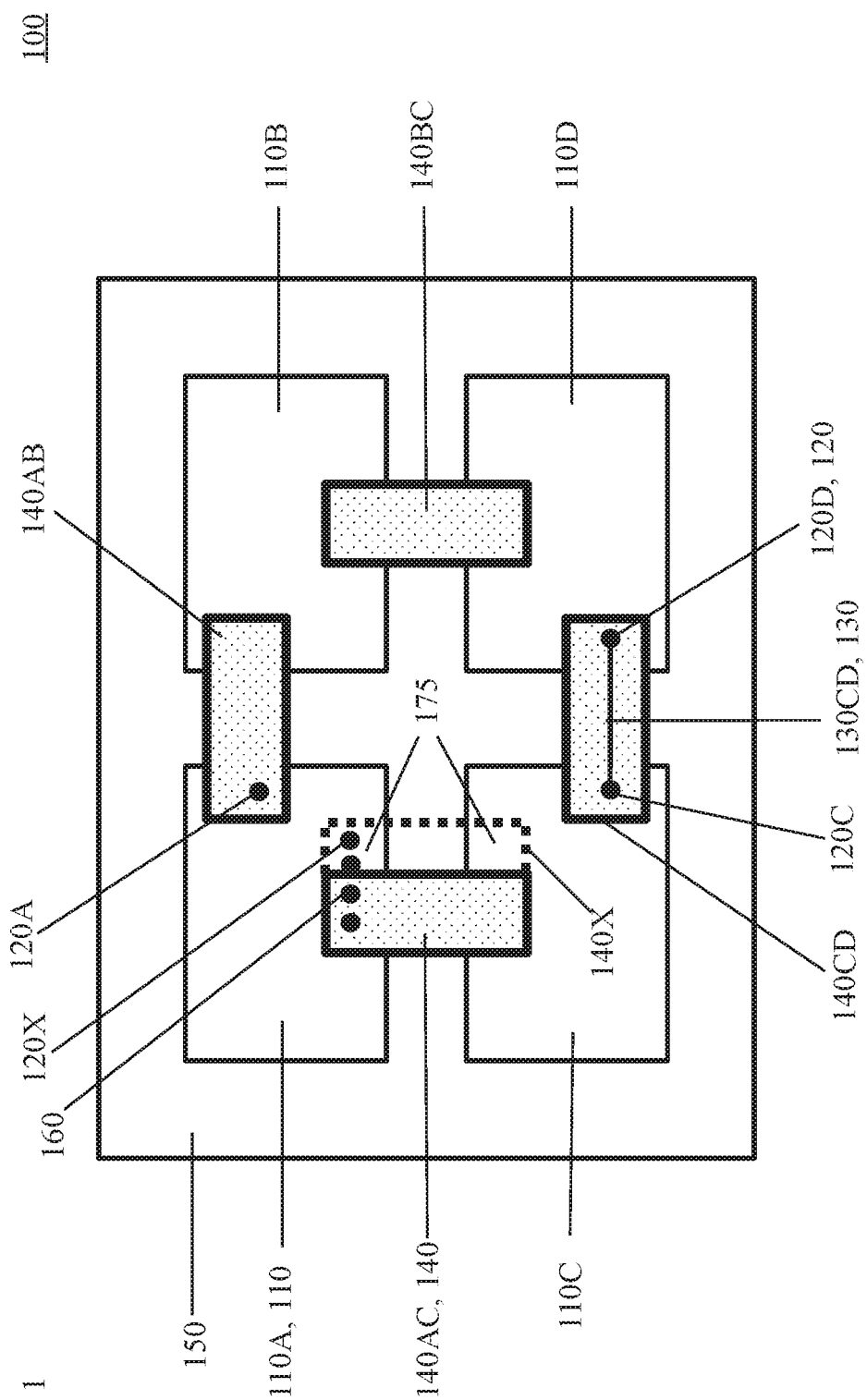
FIG. 1 is a drawing of a multichip module (MCM) with pairwise bridge connectors.

It is to be understood that the various layers and/or regions shown in the accompanying drawings are not drawn to scale, and that one or more layers and/or regions of a type commonly used in a, for example, interconnection technology may not be explicitly shown in a given drawing. This does not imply that the layers and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin", or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Referring now to the Figures, FIG. 1 is a drawing of a multichip module (MCM) 100, in this case a quadchip module (QCM), with pairwise bridge connectors (140AB, 140AC, 140BC, and 140CD, typically 140). The pairwise bridge connectors 140 contain connectors (typically 130) that connect contacts, typically 120, on two separate chips, (e.g. 110A, 110B, 110C, and 110D, typically 110). For example, connection 130CD is one of multiple connections 130 passing through pairwise bridge connector 140CD that connects contact 120C on chip 110C to contact 120D on chip 110D. The chips 110 are disposed on a substrate 150 creating the MCM 100.

Pairwise bridge connectors 140 perform well when connecting 130 contacts 120 that are on two adjacent chips 110. However, when using pairwise bridge connectors 140 to connect contacts 120 on non-adjacent chips 110, for example connecting contact 120A to 120D, sometimes the connection 130 needs to go through two or more pairwise bridge connectors 140 and probably the connection 130 length increases.

In MCMs there can be a high density or pitch 160 of contacts 120. Accordingly, the number of connections 130 increases due to the additional contacts 120 connected. The larger number of connections 130 between and among a larger number of chips 110 on a module 150 can cause complexity, increased use of chip space, and increased connection 130 length.

In addition, denser 160 contacts 120 may require a pairwise bridge connector 140 with a larger surface area. Contact 120X is one of the contacts 120 on chip 100 that has no access to a connector 130 within pairwise bridge connector 140AC because the area of pairwise bridge connector 140AC is too small. A pairwise bridge connector 140AC needs an additional area 140X to overlap and enable connection to contact 120X. However, to enable connection 130 to contact 120X, the pairwise bridge connector 14AC becomes larger and creates a larger area of overlap 175 covering the top (or bottom) surface of chip 110A. The large overlap 175 reduces access to the chip surface for other connections and can limit chip cooling.

Figure 2:
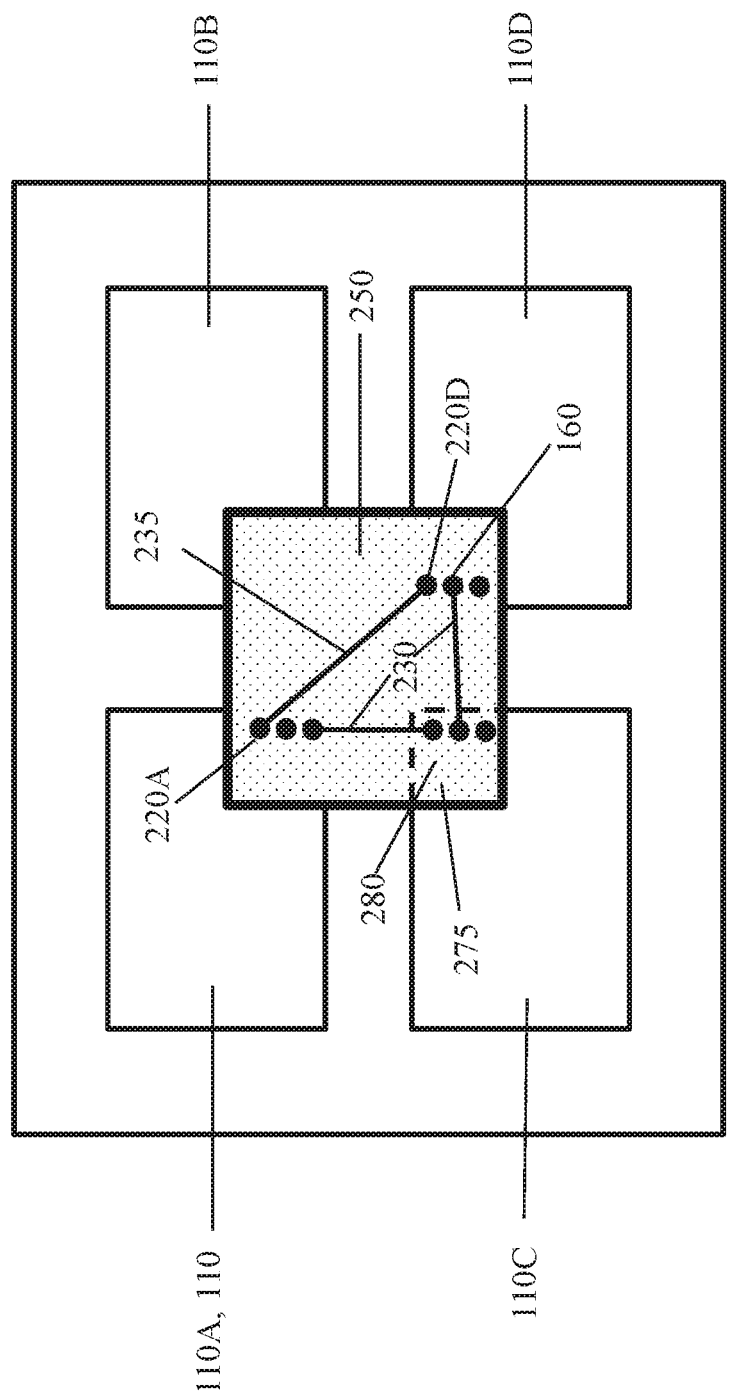
FIG. 2 is a drawing of an MCM with a "rectangular-shaped" bridge connector.

FIG. 2 is a drawing of an MCM 200 with a "rectangular-shaped" bridge connector 250. In this embodiment the group of contacts 120 with a high pitch 160 are moved to interior corners (typically 280) of the chips 110. Interior corners 280 are the corners of the chips 110 that are closest to one another and face each other on a given chip 110 layout of the MGM 200.

A rectangular-shaped bridge connector 250 is disposed over the chip top and/or chip bottoms (depending on contact 120 location on the chip surfaces) of the chips 110. The rectangular-shaped bridge connector 250 overlaps (typically 275) the interior corners 280 of the chips 110 of the MCM 200. In this embodiment, connections 230 between adjacent chips, (e.g. between 110A and 110C and between 110C and 110D), can be made as with the pairwise bridge connectors 140. However, in addition a connection 235 can be made between contacts 120 between non-adjacent chips 110, e.g. between contact 220A on chip 110A and contact 220D on chip 110D. Connections 235 between non-adjacent chips 110 can be made directly without passing over or through a chip 110 that does not have one of the connected 135 contacts (220A, 220D).

The rectangular-shaped bridge connector 250 has the advantage of allowing direct connection 235 to contacts (220A, 220D) on non-adjacent chips 110, while not increasing the overlap 275 on any of the chips 110. In addition, the overlap 275 is confined to interior corners 280 of the chips 110 leaving the remain surface of the chips 110 uncovered by the rectangular-shaped bridge connector 250.

Figure 3:
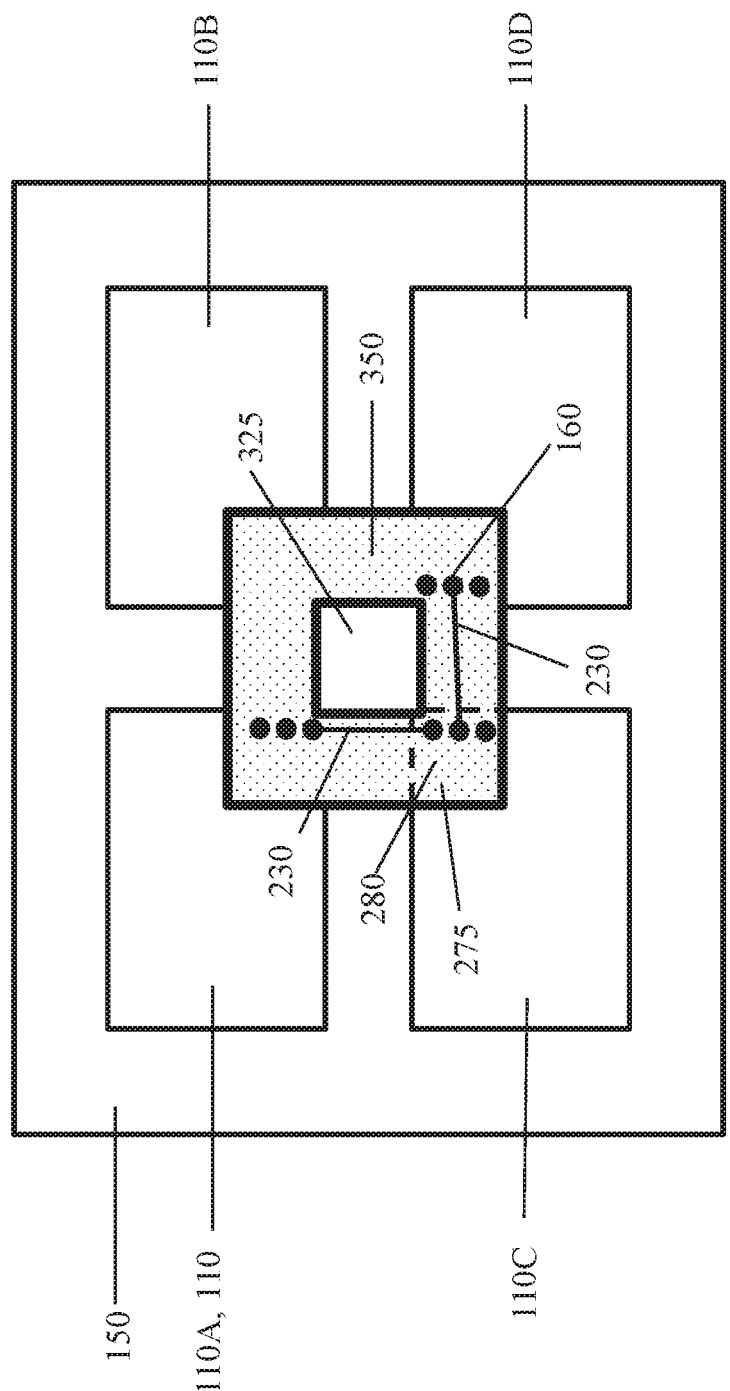
FIG. 3 is a drawing of an MCM with a "window-pane" bridge connector.

FIG. 3 is a drawing of an MCM 300 with a "window-pane" bridge connector 350.

The window-pane bridge connector 350 has an opening 325 within to allow more access through the opening 325 to the substrate 150 and chips 110. Connections 230 as in FIG. 2 are shown. However, direct connection to non-adjacent chips 250 is more circuitous as a result of including the opening 325. The window-pane bridge connector 325 has advantages in MGM 300 where there is a preponderance of connections 230 between adjacent chips with limited connections to non-adjacent chips 110 and where addition access to the substrate 150 and chips 110 is required.

Figure 4:
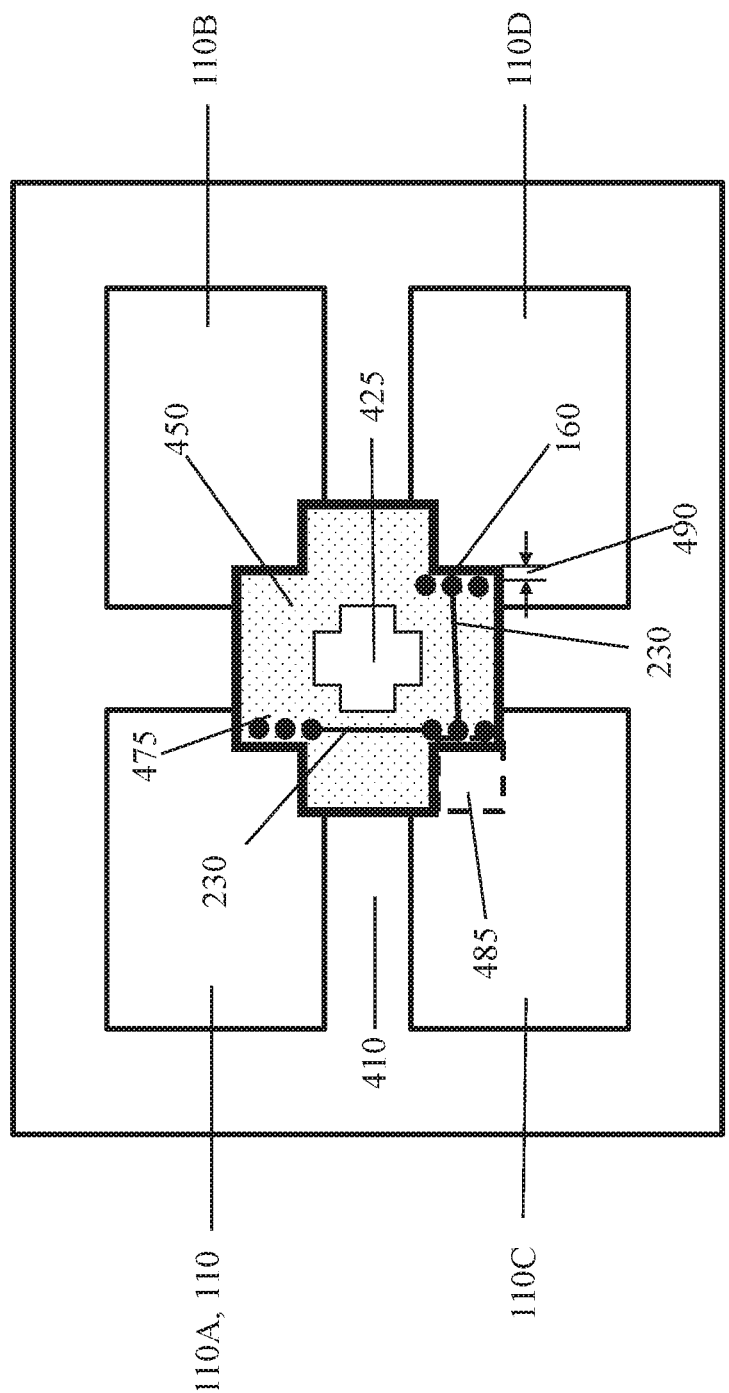
FIG. 4 is a drawing of an MCM with a "plus-shaped" bridge connector.

FIG. 4 is a drawing of an MCM 400 with a "plus-shaped" bridge connector 450. The plus-shaped bridge connector 450 has an optional opening 425 within. In some embodiments, the shape of the opening 425 is similar to the shape of the connector 450 itself. Other shapes are envisioned. In some embodiments, the opening 425 is positioned so it overlaps the spacing 410 between the chips 110 to provide the maximum area of the opening while not reducing the area of overlap, for example overlap 475. The opening 425 allows space for connections that are not covered by the plus-shaped bridge connector 450 overlap 475 and/or for fluid (e.g. air) flow for cooling.

In designs where there are a large number of non-adjacent connections 135, the opening 425 can be made smaller or be omitted to permit routing of the non-adjacent connections 135 directly within and through the connector 450.

An additional advantage of the plus-shaped bridge connector 450 is that overlap area that is not used for connecting 130 to contacts 120 is omitted. Omitted areas, for example 485, are those areas of the bridge connector overlap 475 that would have not access to a used contact 120. By increasing the size of omitted areas 485, the ratio of number of accessible contacts 120 to overlap (175, 275, 475) increases. In other words, the one or more contacts of any of the chips 120 (or contacts 970 on the bridge connector 750, below), is within a tolerance distance 490 from an external edge of the bridge connector 750. In some embodiments, all contacts 120 are within the tolerance 490 from and external edge. In some embodiments the tolerance 490 is less than 3 millimeters (mm).

Figure 5:
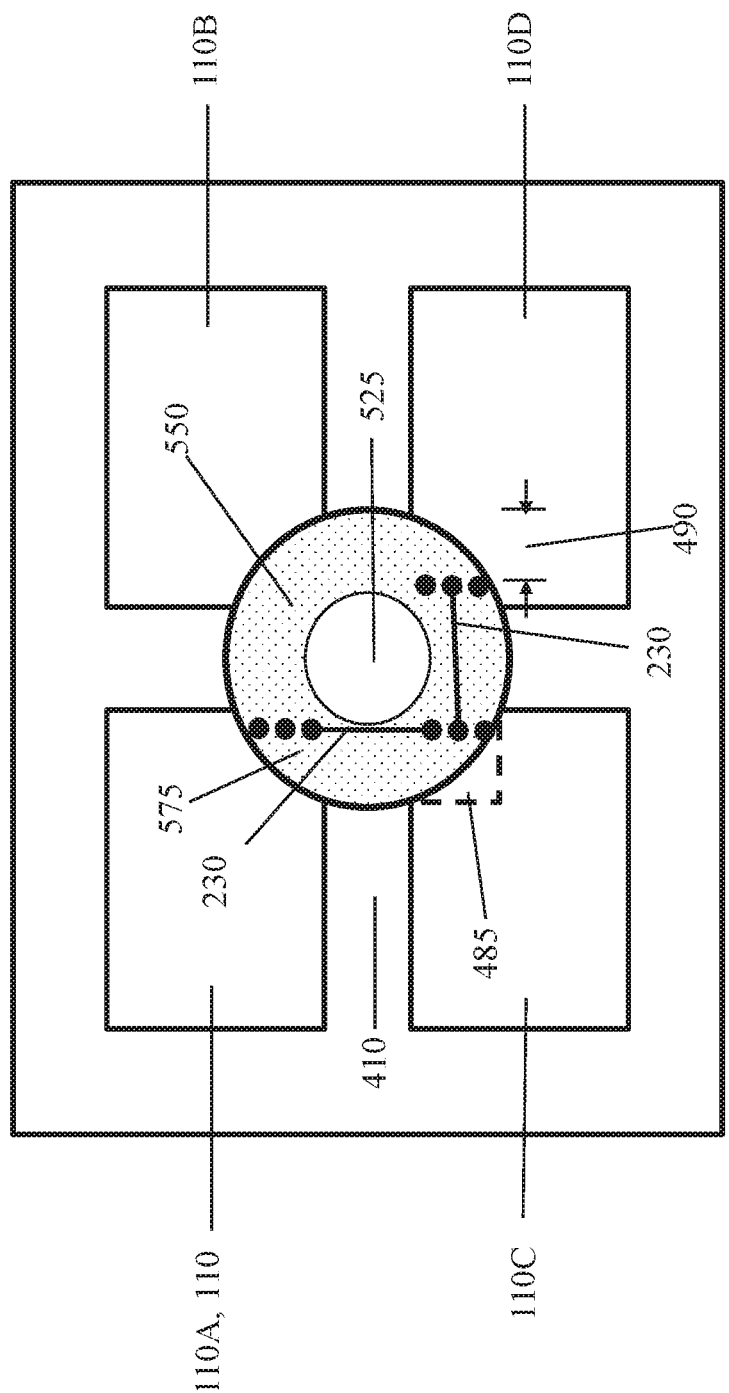
FIG. 5 is a drawing of an MCM with a "circular-shaped" bridge connector.

FIG. 5 is a drawing of an MCM 500 with a "circular-shaped" bridge connector 550. Other curvilinear shapes, e.g. ovals, are envisioned.

The circular-shaped bridge connector 550 has an optional opening 525 within. In some embodiments, the shape of the opening 525 is similar to the curvilinear shape of the connector 550 itself. Other opening shapes are envisioned. In some embodiments, the opening 525 is positioned so it overlaps the spacing 410 between the chips 110 to provide the maximum area of the opening while not reducing the area of overlap, e.g. overlap 575. As before, the opening 525 allows space for connections that are not within the circular-shaped bridge connector 550 and/or for fluid (e.g. air) flow for cooling.

In designs where there are a large number of connections 135 to non-adjacent chips 110, the opening 525 can be made smaller or be omitted to permit routing of the non-adjacent connections 135 within and through the connector 550.

The circular-shaped bridge connector 550 also has omitted areas, typically omitted area 485, that increase the ratio of number of accessible contacts 120 to overlap (175, 275, 475, 575). In some embodiments, the contacts are within a tolerance 490 from an exterior edge of the circular-shaped bridge.

Figure 6:
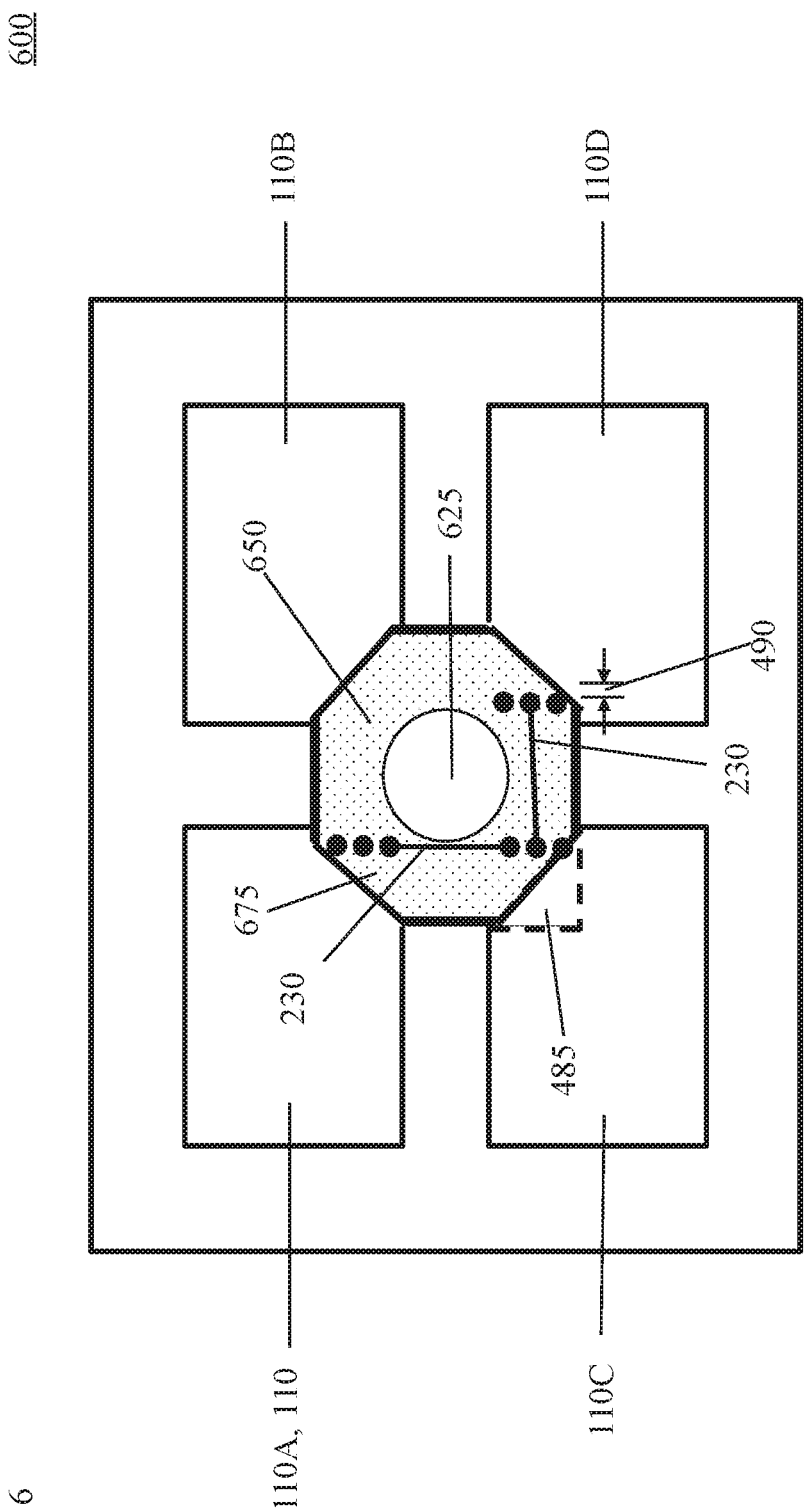
FIG. 6 is a drawing of an MCM with a "polygonal-shaped" bridge connector.

FIG. 6 is a drawing of an MCM 600 with a "polygonal-shaped" bridge connector 650.

The polygonal-shaped bridge connector 650 has an optional opening 625 within. The shape of the opening 625 is shown as circular but, as before, other shapes are envisioned. The opening 625 can be placed in various locations and can be various sizes, as described above, to provide the maximum area of the opening 625 while not reducing the area of overlap, e.g. overlap 675, that provides access to usable contacts 120. As before, the opening 625 allows space for connections outside the polygonal-shaped bridge connector 625 and/or for fluid flow for cooling.

Again, in designs where there are a large number of non-adjacent connections 135, the opening 625 can be made smaller or be omitted to permit routing of the non-adjacent connections 135 within and through the connector 650.

The polygonal-shaped bridge connector 650 also has omitted areas (typically 485) and a tolerance 490 that increase the ratio of number of accessible contacts 120 to overlap (175, 275, 475, 575, 675).

Figure 7:
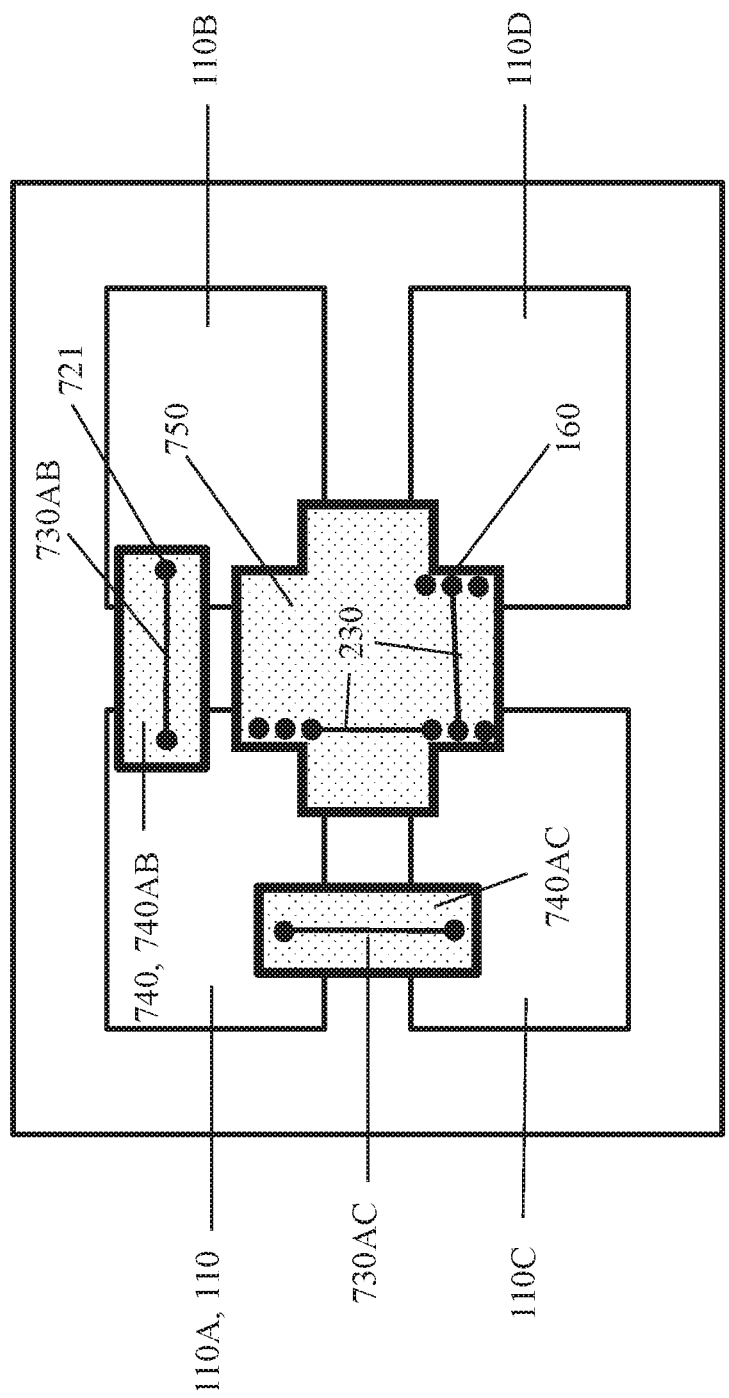
FIG. 7 is a drawing of an MCM with using a central bridge connector and one or more pairwise bridge connectors.

FIG. 7 is a drawing of an MCM with using a central bridge connector 750 and one or more pairwise bridge connectors, for example 740AB and 740AC.

These embodiments can be used when there enough connections (730AB, 730AC) connected to contacts (non-interior contacts, e.g. 721) that cannot or are not placed at an interior corner (typically 280) of a chip 110. In these embodiments, some optimization is realized by using one or more pairwise bridge connectors, typically 740, in combination with a central bridge connector 750. For example, a large number of contacts 120 are not at the interior corners 280 of chip 110A and 110C but are on or near the sides of the respective chips (110A, 110C) facing one another. Rather than running a connection to and through the central bridge connector 750, a pairwise bridge connector is added to provide these non-interior contacts 721 with connections, e.g. 730AC and 730AB.

It is noted that while the central bridge connector 750 is shown as a plus-shaped bridge connector 450 in FIG. 7, any connector disclosed herein or any connector that would be recognized given this disclosure can be used as the central bridge connector 750.

Figure 8:
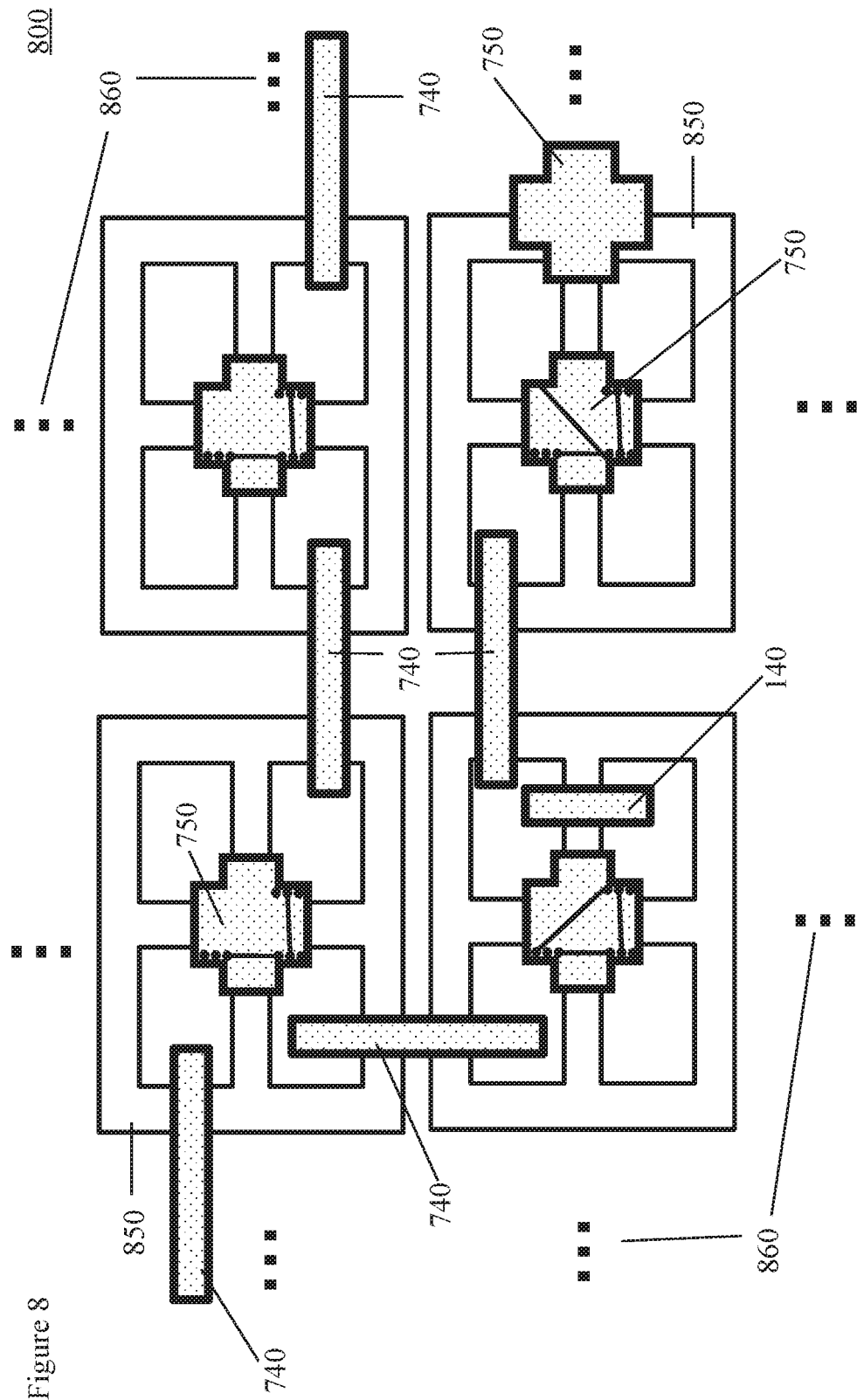
FIG. 8 is a drawing of a plurality of MCMs with an array of bridge connectors.

FIG. 8 is a drawing of an array 800 of MCMs (typically 850) with an array of bridge connectors (740, 750) connecting the chips 110 and MCMs 850 together. It is noted that the array 800 can be an array 800 of two or more MCMs and/or an array 800 that continues in one or more directions, typically 860, connecting a plurality of MCMs 850, The MCMs can be connected together by connecting chips 110 on different modules 850 with pairwise connectors 740, central bridge connectors 750, and/or standard connections, e.g. cable, wire bond, etc.

Each MGM 850 can have a central bridge connector (typically 750) alone or have a central bridge connector 750 in combination with one or more pairwise bridge connectors 140. The central bridge connectors 750 can be the same type in two or more of the MCMs 850 or each MCM 850 can have a different type of central bridge connector 750. The central bridge connectors 750 can be any type disclosed herein or alternatives.

Figure 9:
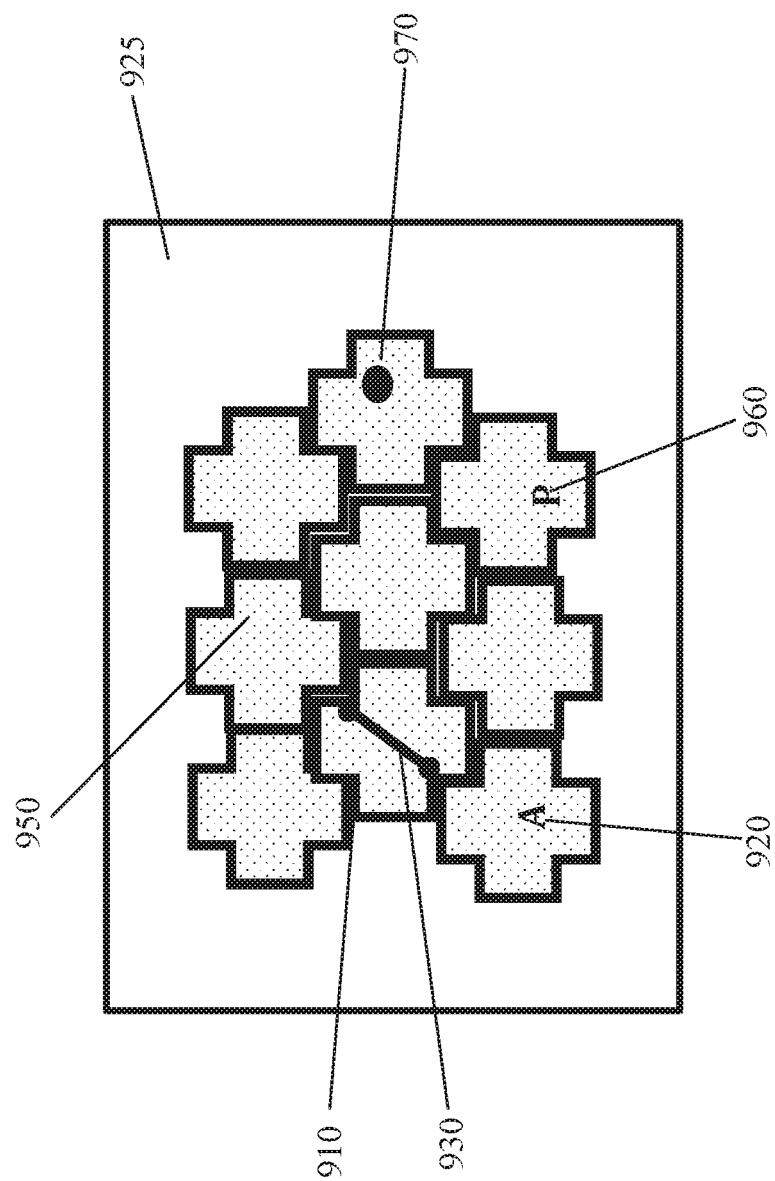
FIG. 9 is a drawing of a dicing pattern for making bridge connectors.

FIG. 9 is a drawing of a dicing pattern 900 for making bridge connectors, typically 950. The pattern 900 has edges 910 that are cut by known techniques like plasma or laser dicing to dice the bridge connectors 950 in the correct shape from a bridge wafer 925.

The bridge wafer 925 can be made of any semiconductor material, e.g. Silicon (Si), with conductive and non-conductive regions and/or layers created by known semiconductor processing techniques. Before dicing, active components 920 (e.g. diodes and transistors), passive components 960 (e.g. resistance, capacitance, inductance), and/or connections 930 (e.g. conductive paths, wiring, vias, etc.) can be added that will be used after bridge contacts 970 on the diced bridge connector 950 connect to contacts 120 on the chips 110. There can be multiple layers of the bridge wafer 925 and therefore the bridge connectors can have active 920 and passive 960 components and connections 930 on multiple levels in 3 dimensions.

The bridge wafer 925 is provided with bridge contacts 970 that can be connected to the chip 110 contacts 120 by known techniques, for example bridge contacts 970 include one or more of the following: C4, Copper (Cu) pillars, solder pads, etc.

Figure 10:
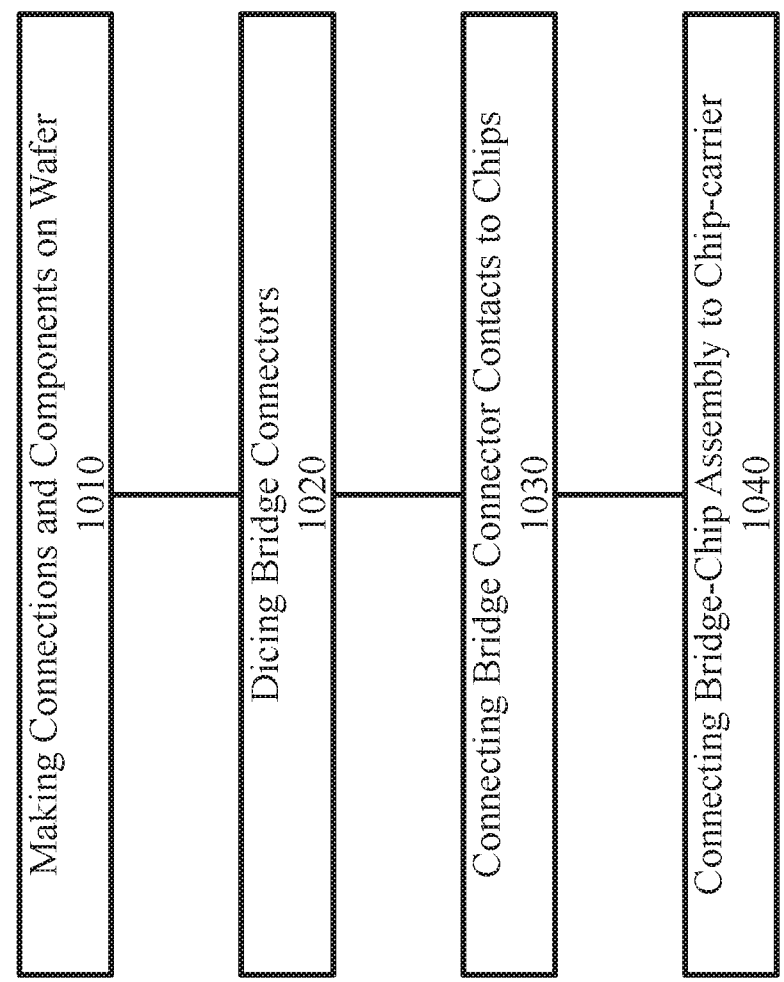
FIG. 10 is a flow chart of a method of making bridge connectors.

FIG. 10 is a flow chart 1000 of a method of making bridge connectors (250, 350, 450, 550, 650, typically 750).

Step 1010 begins with using standard lithograph processes to place active components 920, passive components 960, connections 930, and bridge contacts 970 into the bridge wafer 925.

Step 1020 performs the dicing of the bridge connectors 750 from the bridge wafer 925, e.g. by plasma or laser dicing.

Step 1030 performs the connecting of the bridge connector to the chips 110 on the MCM module (100, 850). In some embodiments the bridge connector 750 is placed in a cavity/trench in a substrate or laminated chip carrier. In other embodiments the bridge connector 750 can be placed on the chips 110 above a chip carrier. Standard electrical connection techniques electrically attach the contacts 120 of the chips 110 to the bridge contacts 970.

Step 1040 performs the electrical connecting of contacts on the bridge-chip assembly (e.g. 100, 850) to contacts on one or more chip carriers, handlers, and/or MCMs, e.g. see contacts 1160 on MCM 1150 in FIG. 11 below.

Figure 11:
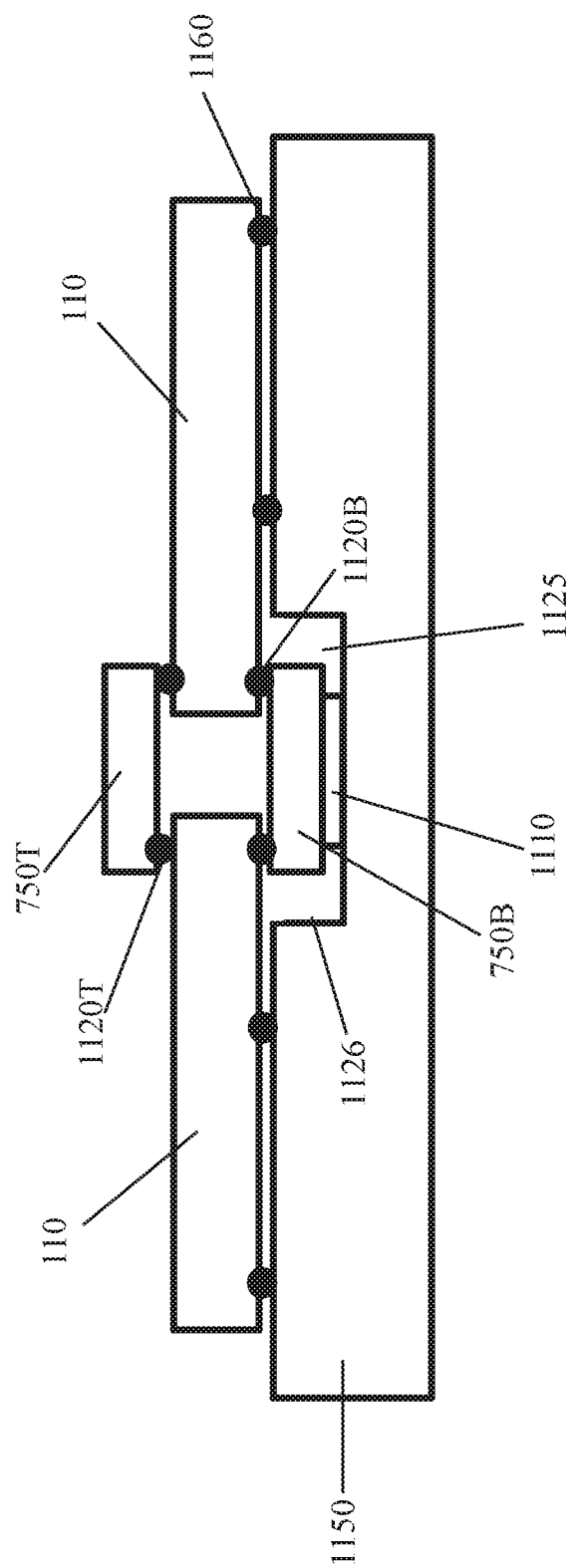
FIG. 11 is an elevation view showing example bridge connectors connected to chips on MCMs.

FIG. 11 is an elevation view 1100 showing example bridge connectors (750T, 750B) connected to chips 110 on an MCM 1150.

The MCM 1150, which could also be a chip 110 handler, has one or more trenches 1125 in which a bottom bridge connector 750B is placed and attached 1110 to the MCM 1150, e.g. with an adhesive 1110. Connections 1120E are made between the bridge connector contacts 970 and the chip 110 contacts 120. In alternative embodiments, the bridge connector 750 can be located on top of the chips 110 so a top bridge connector 750T and/or bottom bridge connector 750B can be used. The top bridge connector 750T has bridge connector contacts 970 connected to chip 110 contacts 120 on the top of the chip surface.

In some embodiments, the depth 1126 of the trench 1125 is deep enough so that the top of the bottom bridge connector 750B is coplanar with the top of the MCM 1150. In some embodiments, if the thickness of the bottom bridge connector 750B is thinner than the interconnect height of the interconnections 1160 between the MCM 1150 and the chips 110, the trench depth 1126 can be reduced or the trench 1125 can be eliminated.

While not shown, it is noted and will be understood that generally there are several metal connection layers, circuitry layers, and/or via connections between these layers in the chips 100, bridges (750T, 750B), MCMs 1150, other chip carriers, and/or chip handlers. The embodiments disclosed are envisioned to work with any or all of these structures.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A bridge connector comprising:
   one or more semiconductor layers in the bridge connector, the bridge connector having a bridge connector shape, the bridge connector shape having one or more edges;
   one or more bridge connector contacts on a surface of the bridge connector shape, all the bridge connector contacts being within a tolerance distance from one or more of the edges;
   one or more connections, the connections running through one or more of the semiconductor layers and connecting two or more of the bridge connector contacts; and
   an opening passing completely through the bridge connector, the opening having an opening shape, the opening shape being non-rectangular, and the opening being centered within the bridge connector and not in the tolerance distance.

2. A connector, as in claim 1, where the semiconductor layers contain one or more active components.

3. A connector, as in claim 1, where the semiconductor layers contain one or more passive components.

4. A connector, as in claim 1, where the opening shape is one of the following: a plus-shape, a circle, and an oval.

5. A connector, as in claim 1, where bridge connector contacts are all located on one or more corners of the bridge connector.

6. A connector, as in claim 4, where the bridge connector shape is similar to the opening shape.

7. A connector, as in claim 6, where one or more of the connections takes a circuitous path around the opening.

8. A multi-chip module (MCM) comprising:
   a substrate;
   two or more chips disposed on the substrate, the chips having one or more chip contacts, the chip contacts on each of the chips being on an interior corner of the chip, the interior corners facing one another;
   a central bridge connector, the central bridge connector having a bridge connector shape, one or more semiconductor layers, one or more edges, one or more bridge contacts on a surface of the central bridge connector, each of the bridge contacts being within a tolerance distance of one of the edges, and one or more connections connecting two or more of the bridge contacts; and
   an opening passing completely through the central bridge connector, the opening having an opening shape, the opening being centered within the central bridge connector and the opening not being in the tolerance distance, the opening shape being non-rectangular,
   where the central bridge connector overlaps the interior corners so that each of one or more of the bridge contacts is in electrical contact with each of one or more of the chip contacts and the opening overlaps one or more spacings between two or more of the chips.

9. An array of multi-chip modules (MCMs) comprising:
   two or more MCMs, each of the MCMs disposed on a substrate, the MCMs comprising:
      two or more chips disposed on the substrate, the chips having one or more chip contacts, the chip contacts on each of the chips being on an interior corner of the chip, the interior corners facing one another on the substrate;
      a central bridge connector, the central bridge connector having a bridge connector shape, one or more semiconductor layers, one or more edges, one or more bridge contacts on a surface of the central bridge connector, each of the bridge contacts being within a tolerance distance of one of the edges, and one or more connections connecting two or more of the bridge contacts; and
      an opening passing completely through the central bridge connector, the opening having an opening shape, the opening being centered within the central bridge connector and the opening not being in the tolerance distance,
      where the central bridge connector overlaps the interior corners so that each of one or more of the bridge contacts is in electrical contact with each of one or more of the chip contacts and the opening overlaps one or more spacings between two or more of the chips; and
      one or more inter-MCM connections between one or more chip contacts on a first chip on a first MCM and a second chip on a second MCM, the inter-MCM connections contained in one of: a central bridge connector and a pairwise bridge connector.

10. An MCM in the array, as in claim 9, where the central bridge connector does not overlap the interior corners outside the tolerance distance.

11. An MCM in the array, as in claim 9, where the tolerance distance is uniform and less than 3 millimeters (mm).

12. An MCM in the array, as in claim 9, where there are one or more active components in one or more of the semiconductor layers.

13. An MCM in the array, as in claim 9, where there are one or more passive components in one or more of the semiconductor layers.

14. An MCM in the array, as in claim 9, where one or more of the connections connects two bridge contacts, each of the bridge contacts overlapping a non-adjacent chip, and the one or more connections connecting two or more of the bridge contacts are circuitously routed to avoid the opening.

15. An MCM in the array, as in claim 9, where the bridge connector shape is similar to the opening shape.

16. An MCM in the array, as in claim 9, further comprising one or more pairwise bridge connectors having pairwise connections, each pairwise connection connecting two non-interior chip contacts, each non-interior chip connection being on an adjacent chip.

17. An MCM in the array, as in claim 9, where the central bridge connector is place in a trench in the substrate.

18. An MCM in the array, as in claim 9, where the central bridge connector is placed over a top surface of the chips.

19. An array, as in claim 9, that extends in 2 directions on the substrate.

20. An MCM in the array, as in claim 15, where the opening is used for air flow cooling.

* * * * *